(12) United States Patent
Huang et al.

(10) Patent No.: US 12,652,896 B2
(45) Date of Patent: Jun. 9, 2026

(54) DISPLAY PANEL WITH REINFORCED CONDUCTIVE TRACES

(71) Applicant: Century Technology (Shenzhen) Corporation Limited, Shenzhen (CN)

(72) Inventors: Chan-Kuan Huang, New Taipei (TW); Chao Wu, Shenzhen (CN); Deng-Kai Chang, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 365 days.

(21) Appl. No.: 18/211,339

(22) Filed: Jun. 19, 2023

(65) Prior Publication Data

US 2024/0006571 A1 Jan. 4, 2024

(30) Foreign Application Priority Data

Jun. 30, 2022 (CN) .......................... 202210768943.3

(51) Int. Cl.
| | |
|---|---|
| *H10H 20/857* | (2025.01) |
| *H10H 20/01* | (2025.01) |
| *H10W 90/00* | (2026.01) |

(52) U.S. Cl.
CPC .......... *H10H 20/857* (2025.01); *H10W 90/00* (2026.01); *H10H 20/0364* (2025.01)

(58) Field of Classification Search
CPC ................. H10H 29/14; H10H 29/142; H10H 29/832–8321; H10H 29/842; H10H 29/852–853; H10H 29/857; H10H 20/84; H10H 20/852–853; H10H 20/857; H01L 25/167; H01L 25/0753
See application file for complete search history.

(56) References Cited

U.S. PATENT DOCUMENTS

| | | | |
|---|---|---|---|
| 7,535,028 B2 * | 5/2009 | Fan | H10H 29/14 |
| | | | 257/89 |
| 8,149,346 B2 | 4/2012 | Kimura | |
| 11,658,165 B2 * | 5/2023 | Kim | H10H 20/852 |
| | | | 257/89 |

(Continued)

FOREIGN PATENT DOCUMENTS

| | | | | |
|---|---|---|---|---|
| CN | 115347011 A | * | 11/2022 | H01L 25/0753 |
| CN | 115868247 A | * | 3/2023 | H10K 71/40 |

(Continued)

*Primary Examiner* — Scott B Geyer

(74) *Attorney, Agent, or Firm* — ScienBiziP, P.C.

(57) ABSTRACT

A display panel includes a substrate, a plurality of LEDs, a planarization layer, and a patterned first conductive layer. The plurality of LEDs are on the substrate, each of the plurality of LEDs includes a first electrode facing a front side of the display panel. The planarization layer covers the plurality of LEDs. The first conductive layer is on the planarization layer. The planarization layer defines a plurality of holes, the electrode is exposed by a corresponding hole of the plurality of holes, and the first conductive layer electrical connects to the first electrode through the corresponding hole. The first conductive layer further comprises a trace portion and a plurality of reinforcing portions, each of the plurality of reinforcing portions is aligned with the corresponding hole and is attached to the trace portion. Methods of fabricating the display panel are further disclosed.

20 Claims, 5 Drawing Sheets

100

(56)         References Cited

U.S. PATENT DOCUMENTS

| | | | | |
|---|---|---|---|---|
| 2017/0294565 A1 * | 10/2017 | Kim | ................... | H10H 20/814 |
| 2018/0190631 A1 * | 7/2018 | Kim | ................... | G02F 1/13336 |
| 2020/0152693 A1 * | 5/2020 | Zou | ................... | H10H 20/8314 |
| 2020/0273786 A1 * | 8/2020 | Di | ................... | H01L 23/49827 |
| 2020/0395507 A1 * | 12/2020 | Lyu | ................... | H10H 29/8512 |
| 2020/0395510 A1 * | 12/2020 | Bower | ................ | H10H 20/857 |
| 2021/0043796 A1 * | 2/2021 | Hartmann | .......... | H01L 25/0753 |
| 2021/0159378 A1 * | 5/2021 | Lee | ................... | H10H 20/8312 |
| 2022/0238774 A1 * | 7/2022 | Chaji | ................... | H10F 77/306 |
| 2022/0375904 A1 * | 11/2022 | Chen | ................... | H01L 25/0753 |
| 2022/0376150 A1 * | 11/2022 | Wang | ................... | H10H 20/01 |
| 2023/0015476 A1 * | 1/2023 | Rass | ................... | H10H 20/84 |
| 2023/0043951 A1 * | 2/2023 | Wang | ............... | H01L 23/49838 |
| 2023/0072512 A1 * | 3/2023 | Zhang | ................ | H10H 20/857 |
| 2023/0108577 A1 * | 4/2023 | Akimoto | ............... | H10H 29/41 |
| | | | | 257/79 |
| 2023/0155065 A1 * | 5/2023 | Wildeson | ............... | H10H 20/01 |
| | | | | 257/79 |
| 2023/0216015 A1 * | 7/2023 | Akimoto | ......... | H10H 20/01335 |
| | | | | 257/79 |
| 2024/0162402 A1 * | 5/2024 | Pai | ........................ | H10H 20/857 |
| 2024/0297157 A1 * | 9/2024 | Kaneki | ..................... | G09F 9/30 |
| 2024/0421258 A1 * | 12/2024 | Chang | ................ | H10H 29/8321 |
| 2025/0015243 A1 * | 1/2025 | Bang | ................... | H10H 29/842 |

FOREIGN PATENT DOCUMENTS

| | | | | | |
|---|---|---|---|---|---|
| DE | 102017129926 A1 | * | 6/2018 | ......... | H01L 25/0753 |
| KR | 20160010537 A | * | 1/2016 | ........... | H01L 25/167 |
| KR | 20200049394 A | * | 5/2020 | ............. | H01L 33/58 |
| KR | 20210057941 A | * | 5/2021 | ......... | G06F 3/04212 |
| TW | 202218170 A | | 5/2022 | | |

* cited by examiner

200

Providing a plurality of light emitting diodes (LEDs) on a substrat — 301

Providing a planarization layer on the substrate and the plurality of LEDs — 302

Defining a plurality of holes on the planarization layer — 303

Forming a patterned first conductive layer — 304

DISPLAY PANEL WITH REINFORCED CONDUCTIVE TRACES

FIELD

The subject matter herein generally relates to displays, specifically to display panels, and manufacture methods for the display panels.

BACKGROUND

Existing display panels with micro light emitting diodes (LEDs) usually use a transparent conductive material, such as indium tin oxide, to form traces for connecting electrodes of the LEDs at an end away from a substate to which the LEDs are bonded, so that the light can be transmitted through the trace.

The traces are on a planarization layer, and the planarization layer covers the plurality of LEDs and defines a plurality of holes aligned with the LEDs. The traces which are transparent are connected to the LEDs through the holes. However, the traces are inclined to fracture at positions of the holes.

Therefore, there is room for improvement within the art.

BRIEF DESCRIPTION OF THE DRAWINGS

Implementations of the present disclosure will now be described, by way of embodiment, with reference to the attached figures, wherein.

DETAILED DESCRIPTION

Figure 1:
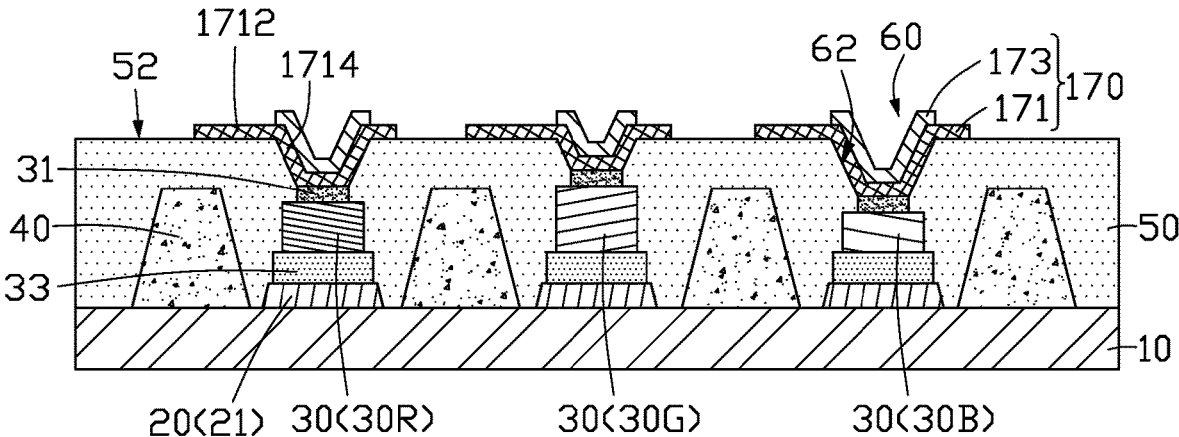
FIG. 1 is a cross-sectional view of a display panel according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

"Optional" or "optionally" means that the subsequently described circumstance may or may not occur, so that the description includes instances where the circumstance occurs and instances where it does not.

"Above" means one layer is located on top of another layer. In one example, it means one layer is situated directly on top of another layer. In another example, it means one layer is situated over the second layer with more layers or spacers in between.

When a feature or element is herein referred to as being "on" another feature or element, it can be directly on the other feature or element or intervening features and/or elements may also be present. It will also be understood that, when a feature or element is referred to as being "connected", "attached" or "coupled" to another feature or element, it can be directly connected, attached or coupled to the other feature or element or intervening features or elements may be present.

The "light emitting diode (LED)" referred to means micro LED or mini LED with a size of 1-200 microns.

FIG. 1 illustrates a display panel 100 according to a first embodiment of the present disclosure. The display panel 100 includes a substrate 10, a plurality of light emitting diodes (LEDs) 30, a planarization layer 50, and a patterned first conductive layer 170. The LEDs 30 are on the substrate 10, and each LED 30 includes a first electrode 31 at an end facing a front side of the display panel for viewers viewing images displayed. The planarization layer 50 is on the substrate 10 and covers the LEDs 30. A plurality of holes 60 are defined in the planarization layer 50, each hole 60 exposes a first electrode 31. The first conductive layer 170 is on a side of the planarization layer 50 facing the front side. The first conductive layer 170 covers the holes 60 and is electrically connected to the first electrodes 31. The first conductive layer 170 includes a trace portion 171 and a plurality of reinforcing portions 173, each reinforcing portion 173 is aligned with a hole 60, and is configured for reinforcing the trace portion 171.

In this embodiment, the reinforcing portions 173 are on a side of the trace portion 171 facing the front side of the display panel 100. The trace portion 171 is attached to a wall 62 of each hole 60, and covers the corresponding hole 60. Specifically, the trace portion 171 is a patterned conductive layer including a plurality of traces arranged on the planarization layer 50. The trace portion 171 supplies power to each LED 30 by electrically connecting to the first electrode 31 of each LED 30. The trace portion 171 includes a planar portion 1712 on a top surface 52 of the planarization layer 50 and bent portions 1714 at positions of the holes 60. Each bent portion 1714 is connected to the planar portion 1712 and bends at the corresponding hole 60 towards a rear side of the display panel 100 opposite to the front side, so as to be attached to the wall of the corresponding hole 60 and extend to a side of the corresponding first electrode 31 facing the front side of the display panel 100, as such electrically connected to the corresponding first electrode 31. Each reinforcing portion 173 covers the trace portion 171 and the corresponding hole 60. That is, the reinforcing portions 173 at least cover the bent portions 1714 of the trace portion 171.

In this embodiment, the trace portion 171 is a patterned indium tin oxide (ITO) thin film. The reinforcing portions 173 are made of a metal material, such as copper, copper alloy, aluminum alloy, silver, etc. Since the reinforcing portions 173 with better physical properties (such as toughness) are attached to the trace portion 171 at positions of the holes 60, the trace portion 171 is not prone to fracture at positions of the holes 60. Even if the trace portion 171 is fractured due to brittle physical properties, the first conductive layer 170 can still be conductive at the fault because the reinforcing portions 173 are attached to the trace portion 171. In other embodiments, the trace portion 171 can also be made of other transparent conductive material, such as indium zinc oxide, indium zinc tin oxide, zinc oxide, etc.

In this embodiment, the display panel 100 further includes a second conductive layer 20. The second conductive layer 20 is arranged between the substrate 10 and the planarization layer 50. The second conductive layer 20 includes a plurality of connecting pads 21, each LED 30 is on one corresponding connecting pad 21. The LED 30 further includes a second electrode 33 facing the rear side of the display panel 100. The second electrode 33 is electrically connected to one corresponding connecting pad 21.

In this embodiment, the LED 30 is a vertical micro LED, the first electrode 31 and the second electrode 33 are on opposite sides of the LED 30, respectively. By applying an electric current to the first electrode 31 and the second electrode 33 respectively, a voltage difference will be formed between the first electrode 31 and the second electrode 33, so that the LED 30 will emit light. Therefore, the second conductive layer 20 forms a circuit above the substrate 10 to supply power to the second electrodes 33, and the first conductive layer 170 forms a circuit above the planarization layer 50 to supply power to the first electrodes 31, thus causing the LEDs 30 to emit light.

In other embodiments, the LED 30 can also be a front-mounted micro LED. That is, both the first electrode 31 and the second electrode 33 are formed at an end of the LED 30 facing the front side of the display panel 100. In this case, the trace portion 171 is electrically connected to both of the first electrode 31 and the second electrode 33 respectively, thus causing the LEDs 30 to emit light.

In this embodiment, the LEDs 30 further include a plurality of first LEDs 30R configured for emitting red light, a plurality of second LEDs 30G configured for emitting green light, and a plurality of third LEDs 30B configured for emitting blue light. The first LEDs 30R, the second LEDs 30G, and the third LEDs 30B arranged in a certain order, and the luminous intensity of each LED 30 is controlled by the first conductive layer 170 and the second conductive layer 20 to achieve image display.

In this embodiment, thicknesses of the LEDs 30 are different, and depths of the holes 60 corresponding to different LEDs 30 are different. The bent portions 1714 of the trace portion 171 correspond to the holes 60 having greater depths are more likely to be thinner or fracture when forming the thin film.

In this embodiment, the display panel 100 further includes an isolation portion 40 on the substrate 10, configured for separating each adjacent LEDs 30. Specifically, the isolation portion 40 is a black matrix made of an opaque black photoresist material. The isolation portion 40 prevents light mixing by spacing the LEDs 30 emitting different colors of light.

By forming the first conductive layer 170 including the trace portion 171 and the reinforcing portions 173, and arranging the reinforcing portions 173 on the bent portions 1714 of the trace portion 171 responds to the holes 60, it is beneficial to protect the trace portion 171, reduce the risk of fracture of the trace portion 171, and ensure the first conductive layer 170 can still be conductive when the trace portion 171 fractures.

Figure 2:
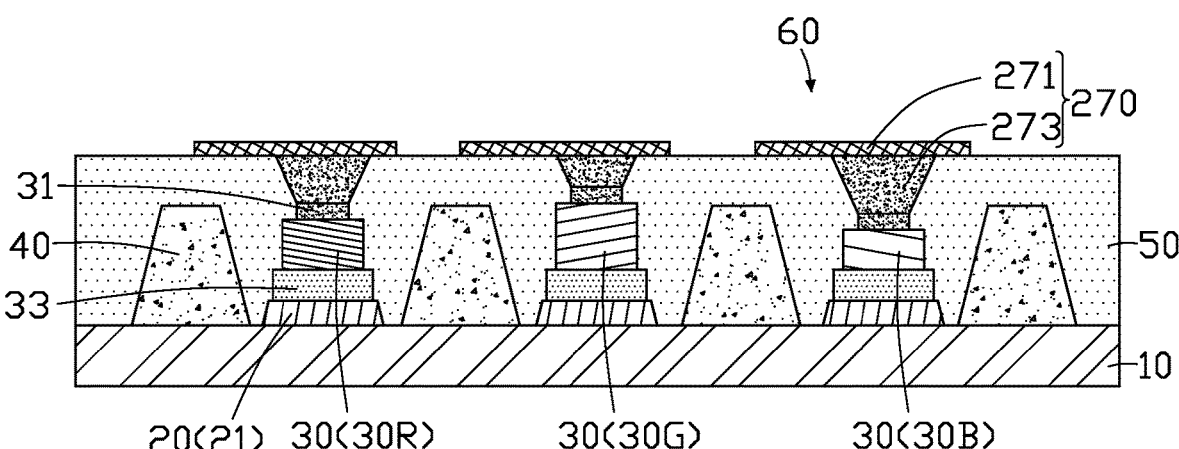
FIG. 2 is a cross-sectional view of a display panel according to another embodiment of the present disclosure.

FIG. 2 illustrates a display panel 200 according to a second embodiment of the present disclosure. The display panel 200 includes a substrate 10, a plurality of LEDs 30, a planarization layer 50, and a patterned first conductive layer 270. The LEDs 30 are on the substrate 10, and each LED 30 includes a first electrode 31 facing a front side of the display panel 200. The planarization layer 50 is on the substrate 10 and covers the LEDs 30. A plurality of holes 60 are defined in the planarization layer 50, each hole 60 exposes a first electrode 31. The first conductive layer 270 is on a side of the planarization layer 50 facing the front side. The first conductive layer 270 covers the holes 60 and is electrically connected to the first electrodes 31. The first conductive layer 270 includes a trace portion 271 and a plurality of reinforcing portions 273, each reinforcing portion 273 is aligned with a hole 60, and is configured for reinforcing the trace portion 271.

The display panel 200 in this embodiment has the same substrate 10, LEDs 30, and planarization layer 50 as the display panel 100 in the first embodiment. The difference between the display panel 100 and the second display panel is: the reinforcing portions 273 filling with each hole 60 and being electrically connected to each first electrode 31, and the patterned trace portion 271 covering the reinforcing portions 273 and being electrically connected to each first electrode 31 through the reinforcing portions 273. Specifically, each reinforcing portion 273 fills in a corresponding hole 50, thus filling the depression created by the hole 50. The trace portion 271 covers the reinforcing portion 273 to avoid bending towards the hole 60 to attach to the first electrode 31.

In this embodiment, the reinforcing portions 273 are made of a conductive paste, such as silver glue, graphene, etc. The conductive paste is beneficial to fill the hole 60 completely, so as to fully contact with the first electrode 31.

In this embodiment, a side of the reinforcing portion 273 facing the front side of the display panel 200 is flush with the planarization layer 50. Specifically, the reinforcing portion 273 and the planarization layer 50 form a flat plane facing the front side of the display panel 200. The trace portion 271 is arranged on the plane to be electrically connected to the first electrodes 31 without bending towards any directions.

By filling the reinforcing portions 273 in the holes 60, and laying the trace portion 271 on the reinforcing portions 273. The trace portion 271 can avoid bending towards the holes 60, thus avoiding fracture on the trace portion 271.

Figure 3:
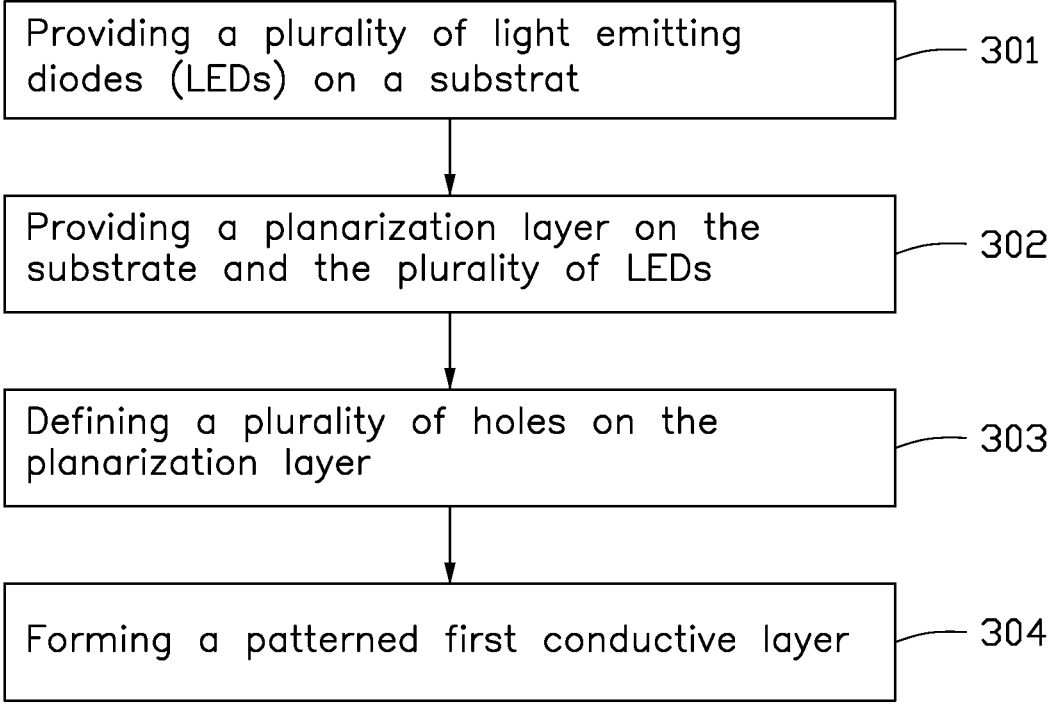
FIG. 3 is a flowchart of a display fabrication method according to an embodiment of the present disclosure.

Referring to FIG. 3, a flowchart is presented in accordance with an example embodiment which is thus illustrated. The example method is provided by way of example, as there are a variety of ways to carry out the method. The method described below can be carried out using the configurations illustrated in FIGS. 4 and 5, for example, and various elements of these figures are referenced in explaining example method. Each block shown in FIG. 3 represents one or more processes, methods or subroutines, carried out in the exemplary method. Additionally, the illustrated order of blocks is by example only and the order of the blocks can change according to the present disclosure. The exemplary method can begin at block 301.

At block 301, a plurality of LEDs is arranged on a substrate, and each LED includes a first electrode at an end facing a front side of the display panel for viewers viewing images displayed.

At block 302, a planarization layer is arranged on the substrate, and the planarization layer covers the LEDs.

At block 303, a plurality of holes is defined in the planarization layer, and each hole exposes a corresponding first electrode.

At block 304, a first conductive layer is formed on the planarization layer. The first conductive layer covers the holes and is electrically connected to each first electrode.

Figure 4:
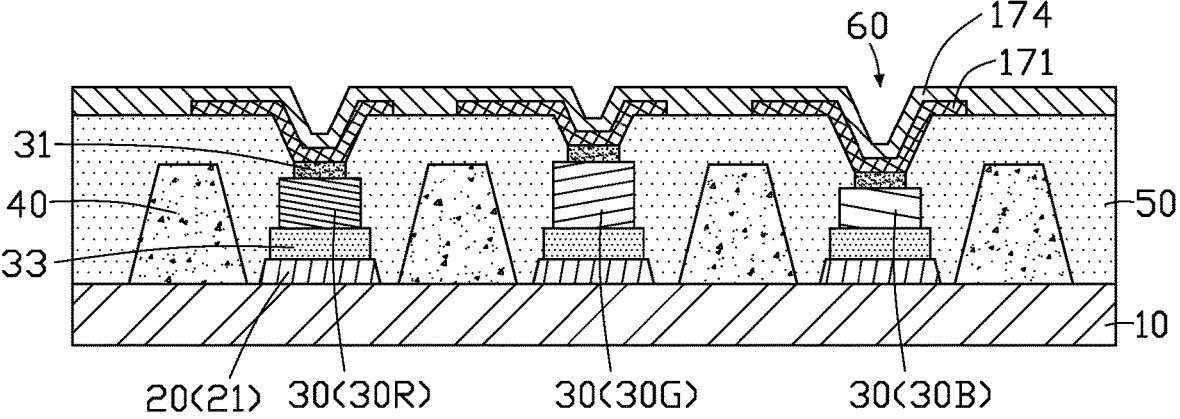
FIG. 4 is a cross-sectional view showing an embodiment of Block 304 of FIG. 4 according to the present disclosure.

For fabricating the display panel 100, referring to FIG. 4, at block 301, a second conductive layer 20 is formed on the substrate 10, the second conductive layer 20 includes a plurality of connecting pads 21, each LED 30 is on one corresponding connecting pad 21. Specifically, the LED 30 is a vertical micro LED including a first electrode 31 and a second electrode 33. The second electrode 33 is electrically connected to one corresponding connecting pad 21, thus the second conductive layer 20 can supply power to each second electrode 33 of the LEDs 30. In other embodiments, block 301 can also not include forming the second conductive layer 20, both the first electrode 31 and the second electrode 33 of each LED 30 are at the same end facing the front side of the display panel.

At block 301, the LEDs 30 include a plurality of first LEDs 30R configured for emitting red light, a plurality of second LEDs 30G configured for emitting green light, and a plurality of third LEDs 30B configured for emitting blue light. The first LEDs 30R, the second LEDs 30G, and the third LEDs 30B are arranged in a certain order.

At block 302, an isolate portion 40 is formed on the substrate 10 before forming the planarization layer 50 on the substrate 10. The isolate portion 40 separates any adjacent LEDs 30 to prevent light mixing of LEDs 30 emitting light of different colors.

At block 304, the first conductive layer includes a trace portion and a plurality of reinforcing portions, each reinforcing portion corresponds to a hole. Specifically, a transparent conductive is deposited on the planarization layer and is etched to form the trace portion 171. The trace portion 171 bends toward the corresponding hole 60 to be attached to a wall of the corresponding hole 60 and electrically connected to the corresponding first electrode 31. A metal layer 174 is formed on the trace portion 171 and covers the holes 60. The metal layer 174 is etched to form the plurality of reinforcing portions 173. The metal layer 174 can be formed by deposition, electroplating, etc. The reinforcing portions 173 can be formed by etching the metal layer 174 through a yellow light process.

Figure 5:
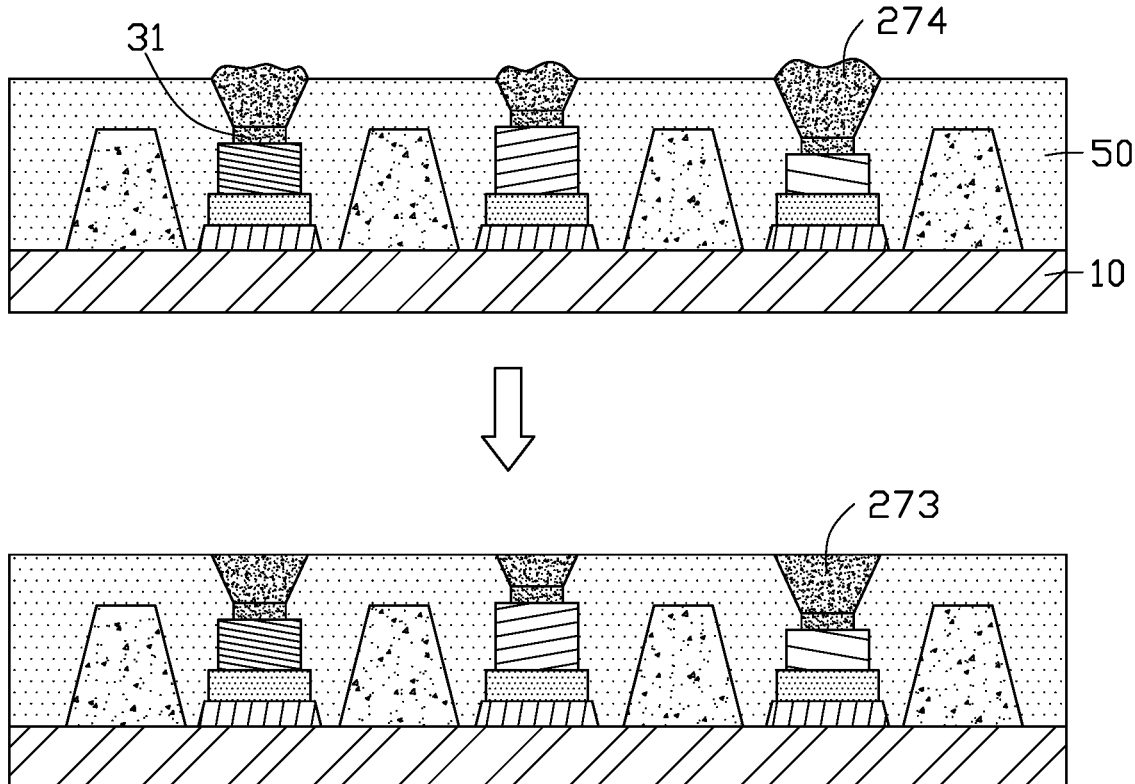
FIG. 5 is a cross-sectional view showing another embodiment of Block 304 of FIG. 4 according to the present disclosure.

For fabricating the display panel 200, referring to FIG. 1 and FIG. 5, at block 304, a conductive paste 274 is filled in a corresponding hole 60, and the conductive paste 274 is solidified to form a reinforcing portion 273. The reinforcing portion 273 is sanded so that a side of the reinforcing portion 273 facing the front side of the display panel is flush with the planarization layer 50. The trace portion 271 is formed on the planarization and covers the reinforcing portions 273, so as to be electrically connected to each first electrode 31.

In this embodiment, the conductive paste 274 can be filled in the holes 60 by high precision dispensing machine or screen printing. In order to ensure that the reinforcing portions 273 can be connected with the trace portion 271, more conductive paste 274 will be filled in one hole 60, and then sanded the solid reinforcing portion 273, so that the reinforcing portions 273 are flush with the planarization layer 50, so as to facilitate the laying of the trace part 271. In other embodiments, an amount of the conductive paste 274 can be controlled so that the solid reinforcing portions 273 exactly flush with the planarization layer 50 without sanding.

By forming the reinforcing portions, the trace portion responds to the holes 60 can be reinforced, avoiding the trace portion fracture at the holes 60. Ensuring an electrical connection between the first conductive layer and the first electrodes 31, so as to improve the yield of the display panel.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A display panel comprising:
   a substrate;
   a plurality of light emitting diodes (LEDs) on the substrate, each of the plurality of LEDs comprising a first electrode facing a front side of the display panel;
   a planarization layer on the substrate, the planarization layer covering the plurality of LEDs;
   a first conductive layer on the planarization layer, a pattern being defined on the first conductive layer; and
   a second conductive layer between the substrate and the planarization layer;
   wherein the planarization layer defines a plurality of holes, the first electrode is exposed by a corresponding hole of the plurality of holes, and the first conductive layer is electrically connected to the first electrode through the corresponding hole; the first conductive layer comprises a trace portion and a plurality of reinforcing portions, each of the plurality of reinforcing portions is aligned with the corresponding hole and is attached to the trace portion; a pattern is defined on the second conductive layer, the second conductive layer comprises a plurality of connecting pads, a corresponding LED of the plurality of LEDs is on a corresponding connecting pad of the plurality of connecting pads, and the corresponding LED comprises a second electrode configured for electrically connecting to the corresponding connecting pad.

2. The display panel of claim 1, wherein the plurality of reinforcing portions is on a side of the trace portion facing the front side of the display panel, the trace portion attaches to a wall of each of the plurality of holes, and is electrically connected to each of the first electrodes; each of the plurality of reinforcing portions attaches to the trace portion and covers the corresponding hole.

3. The display panel of claim 2, wherein the trace portion comprises:
   a planar portion on a top surface of the planarization layer away from the substrate; and
   a plurality of bent portions corresponding to the plurality of holes;
   wherein each of the plurality of bent portions is connected to the planar portion, attached to a wall of the corresponding hole, and extends to contact a surface of the corresponding first electrode facing the front side of the display panel, thereby electrically connecting the corresponding first electrode.

4. The display panel of claim 1, wherein the plurality of reinforcing portions is made of a metal material.

5. The display panel of claim 1, wherein the trace portion is made of a transparent conductive material.

6. The display panel of claim 1, wherein each of the plurality of reinforcing portions is filled in the corresponding hole and electrically connected to the first electrode, the trace portion covers the plurality of reinforcing portions and is electrically connected to the first electrode through the plurality of reinforcing portions.

7. The display panel of claim 6, wherein a side of the plurality of reinforcing portions facing the front side of the display panel is flush with the planarization layer.

8. The display panel of claim 6, wherein the plurality of reinforcing portions is made of conductive paste.

9. The display panel of claim 1, wherein the plurality of LEDs comprises: a plurality of first LEDs, a plurality of second LEDs, and a plurality of third LEDs; each of the plurality of first LEDs, the plurality of second LEDs, and the plurality of third LEDs emits light of a color different from each other.

10. The display panel of claim 1, wherein thicknesses of the plurality of LEDs are different, and depths of the plurality of holes are different corresponding to the thicknesses of the plurality of LEDs.

11. A display panel comprising:
a substrate;
a plurality of light emitting diodes (LEDs) on the substrate, each of the plurality of LEDs comprising a first electrode facing a front side of the display panel;
a planarization layer on the substrate, the planarization layer covering the plurality of LEDs;
a first conductive layer on the planarization layer; and a pattern defined on the first conductive layer;
wherein the planarization layer defines a plurality of holes, the first electrode is exposed by a corresponding hole of the plurality of holes, and the first conductive layer is electrically connected to the first electrode through the corresponding hole; the first conductive layer comprises a trace portion and a plurality of reinforcing portions, each of the plurality of reinforcing portions is aligned with the corresponding hole and is attached to the trace portion; and the plurality of reinforcing portions and the trace portion are made of different conductive materials.

12. The display panel of claim 11, wherein the plurality of reinforcing portions is on a side of the trace portion facing the front side of the display panel, the trace portion is attached to a wall of each of the plurality of holes, and electrically connected to each of the first electrodes; and each of the plurality of reinforcing portions is attached to the trace portion and covers the corresponding hole.

13. The display panel of claim 12, wherein the plurality of reinforcing portions is made of a metal material, and the trace portion is made of a transparent conductive material.

14. The display panel of claim 12, wherein the trace portion comprises:
a planar portion on a top surface of the planarization layer away from the substrate; and
a plurality of bent portions corresponding to the plurality of holes;
wherein each of the plurality of bent portions is connected to the planar portion, attached to a wall of the corresponding hole, and extends to contact a surface of the corresponding first electrode facing the front side of the display panel, thereby electrically connecting the corresponding first electrode.

15. The display panel of claim 11, wherein each of the plurality of reinforcing portions is filled into the corresponding hole and electrically connected to the first electrode, the trace portion covers the plurality of reinforcing portions and is electrically connected to the first electrode through the plurality of reinforcing portions.

16. The display panel of claim 15, wherein a side of the plurality of reinforcing portions facing the front side of the display panel is flush with the planarization layer.

17. The display panel of claim 15, wherein the plurality of reinforcing portions is made of conductive paste, and the trace portion is made of a transparent conductive material.

18. The display panel of claim 11, wherein the plurality of LEDs comprises: a plurality of first LEDs, a plurality of second LEDs, and a plurality of third LEDs; each of the plurality of first LEDs, the plurality of second LEDs, and the plurality of third LEDs emits light of a color different from each other.

19. The display panel of claim 11, further comprising a second conductive layer between the substrate and the planarization layer; wherein a pattern is defined on the second conductive layer, the second conductive layer comprises a plurality of connecting pads, and a corresponding LED of the plurality of LEDs is on a corresponding connecting pad of the plurality of connecting pads, and the corresponding LED comprises a second electrode configured for electrically connecting to the corresponding connecting pad.

20. The display panel of claim 11, wherein thicknesses of the plurality of LEDs are different, and depths of the plurality of holes are different corresponding to the thicknesses of the plurality of LEDs.

* * * * *